US006472690B1

(12) United States Patent
Manabe et al.

(10) Patent No.: US 6,472,690 B1
(45) Date of Patent: Oct. 29, 2002

(54) GALLIUM NITRIDE GROUP COMPOUND SEMICONDUCTOR

(75) Inventors: Katsuhide Manabe, Ichinomiya (JP); Akira Mabuchi, Nagoya (JP); Hisaki Kato, Okazaki (JP); Michinari Sassa, Nagoya (JP); Norikatsu Koide, Nagoya (JP); Shiro Yamazaki, Inazawa (JP); Masafumi Hashimoto, Nagoya (JP); Isamu Akasaki, Nagoya (JP)

(73) Assignees: Toyoda Gosei Co., Ltd., Aichi-ken (JP); Nagoya University, Aichi-ken (JP); Japan Science and Technology Corporation, Saitama-ken (JP)

( * ) Notice: Subject to any disclaimer, the term of this patent is extended or adjusted under 35 U.S.C. 154(b) by 0 days.

(21) Appl. No.: 09/677,789

(22) Filed: Oct. 2, 2000

Related U.S. Application Data

(62) Division of application No. 09/417,778, filed on Oct. 14, 1999, which is a division of application No. 08/956,950, filed on Oct. 23, 1997, now Pat. No. 6,249,012, which is a division of application No. 08/556,232, filed on Nov. 9, 1995, now Pat. No. 5,733,796, which is a continuation of application No. 08/179,242, filed on Jan. 10, 1994, now abandoned, which is a division of application No. 07/926,022, filed on Aug. 7, 1992, now Pat. No. 5,278,433, which is a continuation of application No. 07/661,304, filed on Feb. 27, 1991, now abandoned.

(30) Foreign Application Priority Data

| Feb. 28, 1990 | (JP) | 2-050209 |
| Feb. 28, 1990 | (JP) | 2-050210 |
| Feb. 28, 1990 | (JP) | 2-050211 |
| Feb. 28, 1990 | (JP) | 2-050212 |

(51) Int. Cl.$^7$ .............................................. H01L 33/00
(52) U.S. Cl. ........................ 257/101; 257/102; 257/103
(58) Field of Search .......................... 257/94, 103, 101, 257/102, 615

(56) References Cited

U.S. PATENT DOCUMENTS 4,153,905 A  5/1979  Charmakedze et al.

(List continued on next page.)

FOREIGN PATENT DOCUMENTS

| DE | 2-738329 | 3/1978 |
| DE | 3-046018 | 9/1981 |

(List continued on next page.)

OTHER PUBLICATIONS

Amano, The Research on MOVPE Growth and Application to Photoelectric Physical Property of GaN and a Device Emitting Blue–Color Lights, Doctoral Dissertation of Nagoya University, Chapter 7,8 (pp. 80–94), Jan. 13, 1989.

(List continued on next page.)

Primary Examiner—Minh Loan Tran
(74) Attorney, Agent, or Firm—Pillsbury Winthrop LLP

(57) ABSTRACT

Disclosed herein are (1) a light-emitting semiconductor device that uses a gallium nitride compound semiconductor ($Al_xGa_{1-x}N$) in which the n-layer of n-type gallium nitride compound semiconductor ($Al_xGa_{1-x}N$) is of double-layer structure including an n-layer of low carrier concentration and an n$^+$-layer of high carrier concentration, the former being adjacent to the i-layer of insulating gallium nitride compound semiconductor ($Al_xGa_{1-x}N$); (2) a light-emitting semiconductor device of similar structure as above in which the i-layer is of double-layer structure including an $i_L$-layer of low impurity concentration containing p-type impurities in comparatively low concentration and an $i_H$-layer of high impurity concentration containing p-type impurities in comparatively high concentration, the former being adjacent to the n-layer; (3) a light-emitting semiconductor device having both of the above-mentioned features and (4) a method of producing a layer of an n-type gallium nitride compound semiconductor ($Al_xGa_{1-x}N$) having a controlled conductivity from an organometallic compound by vapor phase epitaxy, by feeding a silicon-containing gas and other raw material gases together at a controlled mixing ratio.

37 Claims, 11 Drawing Sheets

U.S. PATENT DOCUMENTS

| | | | |
|---|---|---|---|
| 4,268,842 A | | 5/1981 | Jacob et al. |
| 4,396,929 A | | 8/1983 | Ohki et al. |
| 4,408,217 A | | 10/1983 | Kobayashi |
| 4,473,938 A | | 10/1984 | Kobayashi et al. |
| 4,608,581 A | | 8/1986 | Bagratishvili et al. |
| 4,614,961 A | | 9/1986 | Khan et al. |
| 4,844,989 A | | 7/1989 | Murdock |
| 4,855,249 A | | 8/1989 | Akasaki et al. |
| 4,911,102 A | | 3/1990 | Manabe et al. |
| 4,945,548 A | | 7/1990 | Kotaki et al. |
| 5,005,057 A | * | 4/1991 | Izumiya et al. ............. 257/103 |
| 5,006,908 A | | 4/1991 | Natsuoka et al. |
| 5,076,860 A | | 12/1991 | Ohba et al. |
| 5,079,184 A | | 1/1992 | Hatano et al. |
| 5,205,905 A | | 4/1993 | Kotaki et al. |
| 5,218,216 A | | 6/1993 | Manabe |
| 5,247,533 A | | 9/1993 | Okazaki et al. |
| 5,278,433 A | | 1/1994 | Manabe et al. |

FOREIGN PATENT DOCUMENTS

| | | |
|---|---|---|
| DE | 4006449 | 9/1990 |
| EP | 0-277597 | 8/1988 |
| EP | 0 620 203 A1 | 10/1994 |
| GB | 1-589351 | 5/1981 |
| JP | 49-29771 | 7/1972 |
| JP | 5-042785 | 4/1975 |
| JP | 54-071589 | 6/1979 |
| JP | 54-071590 | 6/1979 |
| JP | 56-59699 | 5/1981 |
| JP | 56-080183 | 7/1981 |
| JP | 57-018377 | 1/1982 |
| JP | 57-087184 | 5/1982 |
| JP | 57-153479 | 9/1982 |
| JP | 57-046669 | 10/1982 |
| JP | 58-012381 | 1/1983 |
| JP | 58-046686 | 3/1983 |
| JP | 59-228776 | 6/1983 |
| JP | 58-200527 | 11/1983 |
| JP | 60-173829 | 2/1984 |
| JP | 59-228776 | 12/1984 |
| JP | 60-175468 | 9/1985 |
| JP | 61-007671 | 1/1986 |
| JP | 62-119196 | 5/1987 |
| JP | 63-188938 | 8/1988 |
| JP | 63-188977 | 8/1988 |
| JP | 02-042770 | 2/1990 |
| JP | 2623466 | 2/1990 |
| JP | 02-081482 | 3/1990 |
| JP | 02-081483 | 3/1990 |
| JP | 02-081484 | 3/1990 |
| JP | 2-229475 | 9/1990 |
| JP | 2-275682 | 11/1990 |
| JP | 34549 | 2/1991 |
| JP | 03-034549 | 2/1991 |
| JP | 59-228776 | 12/1994 |

OTHER PUBLICATIONS

Jacob et al., Efficient Injection Mechanism for Electroluminescence in GaN, Applied Physics Letter, vol. 30, No. 8, pp. 412–414, Apr. 15, 1977.

Tietjen et al., Vapor Phase Growth Technique and System for Several III–V Compound Semiconductors, RCA Laboratories, 5 pages, Mar. 1969.

Ta, Photoluminescence Characterization of Shallow Impurities in GaN Grown by Chemical Vapor Deposition, Dissertation for University of Southern California, pp. 1–166, Jul. 1981.

Wang, Photoluminescence and Stimulated Emission for GaN, Dissertation for University of Southern California, pp. 1–158, Nov. 1978.

Sayyah, A Study of Growth Mechanisms and Electrical and Optical Properties of Epitaxial $Al_xGa_{1-x}N$ layers Grown by Atmospheric Pressure Metalorganic Chemical Vapor Deposition, Dissertation for University of Southern California, pp. 1–176, Feb. 1986.

Office of Action of Japanese Patent Application No. 2001-238119, Feb. 19, 2002.

Tietjen et al., "Vapor Phase Growth Technique and System for Several III–V Compound Semiconductors", p. 1–9, Mar. 1969, Electronics Research Center.

Azoulay et al., "MOCVD n–Type Doping of GaAs and GaAlAs Using Silicon and Selenium and Fabrication of Double Heterostructure Bipolar Transistor", pp. 453–460, 1984, Journal of Crystal Growth 68,.

Office Action of Japanese Patent Application No. 2001-238156, Mar. 12, 2002.

Khan et al, "Effect of Si on Photoluminescence of GaN", pp. 405–409, Oct. 1985, Solid State Communications, vo. 57, No. 6,.

S.J. Bas, "Silicon and Germanium Doping of Epitaxiala Gallium Arsenide Grown by the Trimethylgallium–Arsine Method", pp. 613–618, 1979, Journal of Crystal Growth 47.

Hiramatsu et al., "Effects of Buffer Layer in MOVPE Growth of GaN Film on Sappire Substrate", pp. 334–341, Nov. 1988, Department of Electronics, School of Engineering.

English Abstract of OKI Japanese Application Published Sep. 22, 1982 under No. 57-153479.

I. Akasaki et al., "Effects of AlN Buffer Layer on Crystallographic Structure . . . by MOVPE", J. Crystal Growth 98 (1989) pp. 209–219.

Liu et al., "Growth morphology and surface–acoustic–wave measurements of AlN films on Sapphire," Journal of Applied Physics, vol. 46, No. 9, Sep. 1975, pp. 3703–3706.

Ilegems et al., "Electrical properties of n–Type Vapor––growth Gallium Nitride", J. Phys. Chem. solids., 1973, vol. 34, pp. 885–895.

Koide et al. "Effect of an AlN Buffer layer on AlGa-Na–Al2O3 Heteroepitaxial Growth by MOVPE", Japanese Journal of Crystal Growth 1986, vol. 13, No. 4, pp. 218–225, 1986.

Sayyah et al. "The Influence of TMA and SiH4 on the Incorporation Rate of GalNAlxGa1–xN Crystals Grown from TMG and NH3", Journal of Crystal Growth 77 (1986), pp. 424–429 North–Holland, Amsterdam.

Bottka, et al., Silicon and beryllium doping of OMVPE Grown . . . , Journal of Crystal Growth 68 (1984) pp. 54–59, North–Holland Amsterdam.

Madar et al., "Growth Anisotrophy in the CaN/Al2O3 System," Journal of Crystal Growth 40, 1997, pp. 239–252.

Koide et al., Epitaxial Growth and Properties of $Al_xGa_{1-x}N$ by MOVPE, Reprinted from Journal of the Electrochemical Society, vol. 133, No. 9, Sep. 1996, pp. 1956–1960.

Boulou et al., "Light emitting Diodes Based on GaN", Philips Tech. Rev., 37, 237–240 No. 9/10, 1977.

English Abstract of OOKI Japanese Application Published Sep. 19, 1982 under No. 57-153479.

I. Akusuki et al., "Effects of AlN Buffer Layer on Crystallographic Structure . . . by MOVPE", J. Crystal Growth 98 (1989) pp. 209–219.

Sayyah, A Study of Growth Mechanisms and Electrical and Optical Properties of Epitaxial $Al_xGa_xN$ Layers Grown by Atmospheric Pressure Metalorganic Chemical Vapor Deposition, A Dissertation presented to Faculty of the Graduate School, University of Southern California, Feb. 1986, pp. 125–136.

Koide et al., Epitaxial Growth and Properties of $Al_xGa_{1-x}N$ by MOVPE, J. Electrochem. Soc.: Solid–State Science and Technology, vol. 133, No. 9, Sep. 1986, pp. 1956–1960.

Masakiyo Matsumura, Semiconductor Devices, Chapter 2, Principle of Diodes, 2.1: pn junction and rectification, Dec. 25, 1986, p. 13.

Kiyoshi Takahashi, Semiconductor Engineering: Basic Characteristics of Semiconductor, Morikita Electric Engineering Series, vol. 4, Chapter 14: Semiconductor Material Technics, 14:1: Forming of Semiconductor Material, Aug. 1, 1975, p. 297.

Hiroyuki Matsunami, Semiconductor Engineering, Chapter 2: Basic Characteristics of Semiconductor, Mar. 25, 1983, pp. 18–31.

Sano et al., Properties of III–V Nitride Semiconductors, Japanese Journal of Applied Physics, vol. 52, No. 5, 1983, pp. 374–387.

Miyoshi Haradome, Basics of Semiconductor Engineering, Chapter 8: Compound Semiconductor, 8:1, Conditions to be Semiconductor, Aug. 30, 1967, p. 161.

A.S. Grove, Physics and Technology of Semiconductor, Chapter 4: Basics of Semiconductor Physics, 1967, translated and published in Japan Jun. 23, 1995, pp. 112–123.

Kazuyo Kadota, The Invention, 39 New Technics Selected by Japan Patent Office; Laser Technics, vol. 94, No. 9 (the first volume); Sep. 1997, pp. 42–49.

Pankove et al., Optical Absorption of GaN, Applied Physics Letters, vol. 17, No. 5, Sep. 1970, pp. 197–198.

Amano et al., Effects of the Buffer Layer in Metalorganic Vapour Phase Epitaxy of GaN on Sapphire Substrate, Thin Solid Films, 163, (1988), pp. 415–420.

Akasaki et al., Effects of AlN Buffer Layer on Crystallographic Structure and on Electrical and Optical Properties of GaN and $Ga_{1-x}Al_xN(0<x<0.4)$ Films Grown on Sapphire Substrate by MOVPE, Journal of Crystal Grown 98 (1989), pp. 209–219.

Bottka et al., Silicon and Beryllium Doping of OMVPE Grown $Al_xGa_{1-x}As$ (x=0–0.3) Using Silane and Diethylberyllium, Journal of Crystal Growth 68 (1984) pp. 54–59.

Hiramatsu et al. "Effects of Buffer Layer in MOVPE Growth of GaN Film on Sapphire Substrate" Japanese Journal of Crystal Growth, 1998, vol. 15, No. 3&4, pp. 334–342.

Elwell et al. "Crystal Growth of Gallium Nitride" Prog. Crystal Growth and Charact. 1988, vol. 17, pp. 53–78.

* cited by examiner

US 6,472,690 B1

GALLIUM NITRIDE GROUP COMPOUND SEMICONDUCTOR

This is a division of application Ser. No. 09/417,778, filed Oct. 14, 1999 (allowed); which is a divisional of 08/956,950 filed Oct. 23, 1997, U.S. Pat. No. 6,249,012; which is a divisional of Ser. No. 08/556,232 filed Nov. 9, 1995, U.S. Pat. No. 5,733,796; which is a continuation of Ser. No. 08/179,242, filed Jan. 10, 1994 (now abandoned); which is a divisional of Ser. No. 07/926,022, filed Aug. 7, 1992, U.S. Pat. No. 5,278,433; which is a continuation of Ser. No. 07/661,304, filed Feb. 27, 1991 (now abandoned); the contents all of which are incorporated herein by reference.

BACKGROUND OF THE INVENTION

1. Field of the Invention

The present invention relates to a light-emitting semiconductor device using gallium nitride group compound which emits a blue light.

2. Description of the Prior Art

It is known that GaN compound semiconductor can be made into a light-emitting semiconductor device, such as a light-emitting diode (LED), which emits a blue light. The GaN compound semiconductor attracts attention because of its high light-emitting efficiency resulting from direct transition and of its ability to emit a blue light which is one of three primary colors.

The light-emitting diode manufactured from the GaN compound semiconductor is composed of an n-layer and an i-layer grown thereon. The n-layer of the GaN compound semiconductor with n-type conduction is directly grown on a surface of a sapphire substrate or grown on a buffer layer of aluminum nitride formed on the substrate. The i-layer of insulating (i-type) GaN compound semiconductor doped with p-type impurities is grown on the n-layer. (See Japanese Patent Laid-open Nos. 119196/1987 and 188977/1988.) The light-emitting diode of this structure has room for improvement in luminous intensity. In addition, it comprises no p-n junction but it is made by joining the i-layer and n-layer.

An electric property of the GaN compound semiconductor shows inherently n-type conduction even though it is not deliberately doped with n-type impurities, and unlike silicon and similar semiconductors, when it is doped with zinc of p-type impurities, the electric property shows not p-type conduction but insulation. Moreover, the production of n-type GaN involves many difficulties in controlling conductivity.

SUMMARY OF THE INVENTION

It is the first object of the present invention to improve a luminous efficiency of a GaN group light-emitting diode.

It is the second object of the present invention to provide a new layer structure which improves a luminous efficiency of a GaN group light-emitting diode.

It is the third object of the present invention to provide a technology for production of n-type GaN group compound semiconductor in which conductivity is easily controlled.

After experience in the manufacture of the above-mentioned GaN light-emitting diode, the present inventors established a technology for a vapor phase epitaxy of the GaN group semiconductor with organometal compound. This technology enables a production of a gas-phase grown GaN layer of high purity. In other words, this technology provides n-type GaN with high resistivity without doping with impurities, unlike the conventional technology which provides n-type GaN with low resistivity when no doping is performed.

The First Feature of the Invention

The first feature of the present invention resides in a light-emitting semiconductor device composed of an n-layer of n-type gallium nitride group compound semiconductor ($Al_xGa_{1-x}N$; inclusive of x×0) and an i-layer of insulating (i-type) gallium nitride compound semiconductor ($Al_xGa_{1-x}N$; inclusive of x×0) doped with p-type impurities, in which the n-layer is of double-layer structure including an n-layer of low carrier concentration and an $n^+$-layer of high carrier concentration, the former being adjacent to the i-layer.

According to the present invention, the n-layer of low carrier concentration should preferably have a carrier concentration of $1\times10^{14}/cm^3$ to $1\times10^{17}/cm^3$ and have a thickness of 0.5 to 2 µm. In case that the carrier concentration is higher than $1\times10^{17}/cm^3$, the luminous intensity of the light-emitting diode decreases. In case that the carrier concentration is lower than $1\times10^{14}/cm^3$, since the series resistance of the light-emitting diode increases, an amount of heat generated in the n-layer increases when a constant current is supplied to it. In case that the layer thickness is greater than 2 µm, since the series resistance of the light-emitting diode increases, the amount of heat generated in the n-layer increases when the constant current is supplied to it. In case that the layer thickness is smaller than 0.5 µm, the luminous intensity of the light-emitting diode decreases.

In addition, the $n^+$-layer of high carrier concentration should preferably contain a carrier concentration of $1\times10^{17}/cm^3$ to $1\times10^{19}/cm^3$ and have a thickness of 2–10 µm. In case that the carrier concentration is higher than $1\times10^{19}/cm^3$, the $n^+$-layer is poor in crystallinity. In case that the carrier concentration is lower than $1\times10^{17}/cm^3$, since the series resistance of the light-emitting diode increases, an amount of heat generated in the $n^+$-layer increases when a constant current is supplied to it. In case that the layer thickness is greater than 10 µm, the substrate of the light-emitting diode warps. In case that the layer thickness is smaller than 2 µm, since the series resistance of the light-emitting diode increases, the amount of heat generated in the $n^+$-layer increases when the constant current is supplied to it.

In the first feature of the present invention, it is possible to increase an intensity of blue light emitted from the light-emitting diode by making the n-layer in double-layer structure including an n-layer of low carrier concentration and an $n^+$-layer of high carrier concentration, the former being adjacent to the i-layer. In other words, the n-layer as a whole has a low electric resistance owing to the $n^+$-layer of high carrier concentration, and hence the light-emitting diode has low series resistance and generates less heat when a constant current is supplied to it. The n-layer adjacent to the i-layer has a lower carrier concentration or higher purity so that it contains a smaller amount of impurity atoms which are deleterious to the emission of blue light from the light-emission region (i-layer and its vicinity). Due to the above-mentioned functions, the light-emitting diode of the present invention emits a blue light of higher intensity.

The Second Feature of the Invention

The second feature of the present invention resides in a light-emitting semiconductor device composed of an n-layer of n-type gallium nitride compound semiconductor ($Al_xGa_{1-x}N$; inclusive of x×0) and an i-layer of i-type gallium nitride compound semiconductor ($Al_xGa_{1-x}N$; inclusive of x×0) doped with p-type impurities, in which the i-layer is of double-layer structure including an $i_L$-layer containing p-type impurities in comparatively low concentration and an $i_H$-layer containing p-type impurities in comparatively high concentration, the former being adjacent to the n-layer.

According to the present invention, the $i_L$-layer of low impurity concentration should preferably contain the impurities in concentration of $1\times10^{16}/cm^3$ to $5\times10^{19}/cm^3$ and have a thickness of 0.01 to 1 μm. In case that impurity concentration is higher than $5\times10^{19}/cm^3$, since the series resistance of the light-emitting diode increases, an initial voltage to start emitting light at increases. In case that the impurity concentration is lower than $1\times10^{16}/cm^3$, the semiconductor of the $i_L$-layer shows n-type conduction. In case that the layer thickness is greater than 1 μm, since the series resistance of the light-emitting diode increases, the initial voltage to start emitting light at increases. In case that the layer thickness is smaller than 0.01 μm, the light-emitting diode has the same structure as that of the conventional one.

In addition, the $i_H$-layer of high impurity concentration should preferably contain the impurities in concentration of $1\times10^{19}/cm^3$ to $5\times10^{20}/cm^3$ and have a thickness of 0.02 to 0.3 μm. In case that the impurity concentration is higher than $5\times10^{20}/cm^3$, the semiconductor of the $i_H$-layer is poor in crystallinity. In case that the impurity concentration is lower than $1\times10^{19}/cm^3$, the luminous intensity of the light-emitting diode decreases. In case that the layer thickness is greater than 0.3 μm, since the series resistance of the light-emitting diode increases, an initial voltage to start emitting light at increases. In case that the layer thickness is smaller than 0.02 μm, the i-layer is subject to breakage.

In the second feature of the present invention, it is possible to increase an intensity of blue light emitted from the light-emitting diode by making the i-layer in double-layer structure including an $i_L$-layer containing p-type impurities in comparatively low concentration and an $i_H$-layer containing p-type impurities in comparatively high concentration, the former being adjacent to the n-layer. In other words, this structure (in which the i-layer adjacent to the n-layer is the $i_L$-layer of low impurity concentration) enables electrons to be injected from the n-layer into the $i_H$-layer of high impurity concentration without being trapped in the $i_L$-layer and its vicinity. Therefore, this structure enables electrons to pass through the $i_L$-layer of low impurity concentration, which is poor in luminous efficacy, adjacent to the n-layer, and to reach the $i_H$-layer of high impurity concentration in which electrons emit light with a high efficiency.

The Third Feature of the Invention

The third feature of the present invention resides in a light-emitting semiconductor device composed of an n-layer of n-type gallium nitride compound semiconductor ($Al_xGa_{1-x}N$; inclusive of x×0) and an i-layer of i-type gallium nitride compound semiconductor ($Al_xGa_{1-x}N$; inclusive of x×0) doped with p-type impurities, in which the n-layer is of double-layer structure including an n-layer of low carrier concentration and an n$^+$-layer of high carrier concentration, the former being adjacent to the i-layer, and the i-layer is of double-layer structure including an $i_L$-layer containing p-type impurities in comparatively low concentration and an $I_H$-layer containing p-type impurities in comparatively high concentration, the former being adjacent to the n-layer.

The third feature of the present invention is a combination of the first feature (the n-layer of double layer structure) and the second feature (the i-layer of double layer structure). Therefore, the n-layer of low carrier concentration, the n$^+$-layer of high carrier concentration, the $i_L$-layer of low impurity concentration, and the $i_H$-layer of high impurity concentration should correspond to the respective layers as the first and second features. The carrier concentration and layer thickness are defined in the same manner as in the first and second features.

In the third feature of the present invention, it is possible to increase an intensity of blue light from the light-emitting diode by making the n-layer in double-layer structure including an n-layer of low carrier concentration and an n$^+$-layer of high carrier concentration, the former being adjacent to the i-layer, and also by making the i-layer in double-layer structure including an $i_L$-layer containing p-type impurities in comparatively low concentration and an $i_H$-layer containing p-type impurities in comparatively high concentration, the former being adjacent to the n-layer.

In other words, the n-layer as a whole has a low electric resistance owing to the n$^+$-layer of high carrier concentration, which makes it possible to apply an effective voltage to the junction between the $i_L$-layer and n-layer of low carrier concentration. Having a low carrier concentration, the n-layer adjacent to the $i_L$-layer does not permit non-light-emitting impurity atoms to diffuse into the $i_L$-layer. In addition, this structure (in which the i-layer adjacent to the n-layer is the $i_L$-layer of low impurity concentration) permits electrons to be injected from the n-layer into the $i_H$-layer of high impurity concentration without being trapped in the $i_L$-layer. Therefore, this structure permits electrons to pass through the $i_L$-layer of low impurity concentration, which is poor in luminous efficacy, adjacent to the n-layer, and to reach the $i_H$-layer of high impurity concentration in which electrons emit light with a high efficiency.

For this reason, the light-emitting diode of the present invention has a much higher luminous efficacy than the one having the conventional simple i-n junction.

The Fourth Feature of the Invention

The fourth feature of the present invention resides in a method of producing an n-type gallium nitride compound semiconductor ($Al_xGa_{1-x}N$; inclusive of x×0) from organometal compound by vapor phase epitaxy. This method comprises a step of feeding a silicon-containing gas and other raw material gases together at a proper mixing ratio so that the conductivity of the compound semiconductor is desirably controlled. The mixing ratio is adjusted such that silicon enters the layer of gallium nitride compound semiconductor grown by vapor phase epitaxy and functions as the donor therein. Thus it is possible to vary the conductivity of the n-type layer by adjusting the mixing ratio.

The Fifth Feature of the Invention

The Fifth Feature of the Present Invention resides in a method for producing a light-emitting semiconductor device. The method comprises two steps. The first step involves growing an n$^+$-layer of high carrier concentration (which is an n-type gallium nitride compound semiconductor ($Al_xGa_{1-x}N$; inclusive of x×0) having a comparatively high conductivity) by vapor phase epitaxy from organometal compound. The vapor phase epitaxy is accomplished on a sapphire substrate having a buffer layer of aluminum nitride by feeding a silicon-containing gas and other raw material gases together at a proper mixing ratio. The second step involves growing an n-layer of low carrier concentration (which is an n-type gallium nitride compound semiconductor ($Al_xGa_{1-x}N$; inclusive of x×0) having a comparatively low conductivity) by vapor phase epitaxy from organometal compound. The vapor phase epitaxy is accomplished on the n$^+$-layer formed by the first step by feeding raw material gases excluding the silicon-containing gas. The n-layer of double-layer structure can be produced by properly controlling the mixing ratio of a silicon-containing gas and other raw material gases.

DETAILED DESCRIPTION OF THE INVENTION

The invention will be described in more detail with reference to the following examples.

EXAMPLE 1

Figure 1:
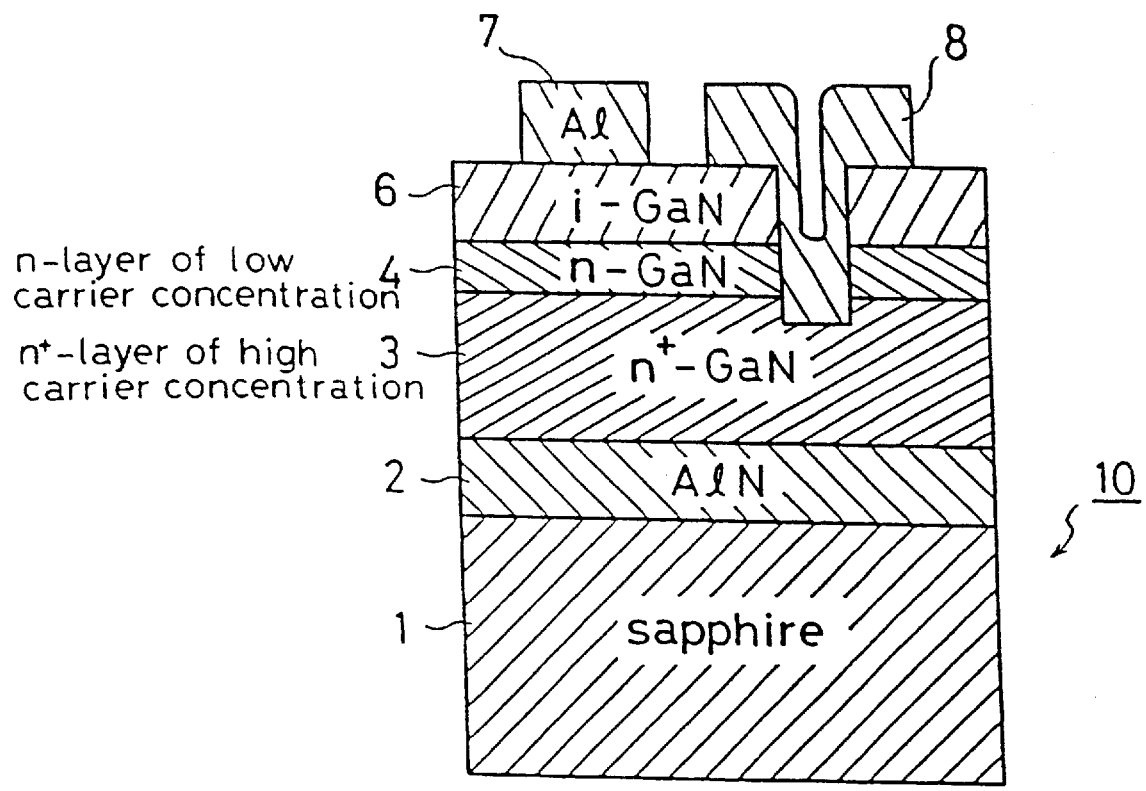
FIG. 1 is a diagram showing a structure of a light-emitting diode shown as Example 1 of the present invention.

In FIG. 1 there is shown a light-emitting diode 10 which has a sapphire substrate 1 on which is formed a buffer layer of 500 Å thick AlN. On the buffer layer 2 are consecutively formed an n$^+$-layer 3 of high carrier concentration of 2.2 μm thick GaN and an n-layer 4 of low carrier concentration of 1.5 μm thick GaN. And an i-(insulating) layer 6 of 0.2 μm thick GaN is formed on the n-layer 4. Aluminum electrodes 7 and 8 are connected to the i-layer 6 and n-layer 3, respectively.

This light-emitting diode 10 was produced by metalorganic vapor phase epitaxy in the following manner. (This process is referred to as MOVPE hereinafter.)

The gases employed in this process are NH$_3$, H$_2$ (as carrier gas), trimethyl gallium (Ga(CH$_3$)$_3$) (TMG hereinafter), trimethyl aluminum (Al(CH$_3$)$_3$) (TMA hereinafter), silane (SiH$_4$), and diethyl zinc (DEZ hereinafter).

The sapphire substrate 1 of single crystal, with its principal crystal plane (a-surface {11$\bar{2}$0}) cleaned by solvent washing and heat treatment, was set on the susceptor placed in a reaction chamber of an MOVPE apparatus.

The sapphire substrate 1 underwent vapor phase etching at 1100° C. with H$_2$ flowing through the reaction chamber at a flow rate of 2 l/min under normal pressure.

On the sapphire substrate 1 was formed the AlN buffer layer 2 (about 500 Å thick) at 400° C. by supplying H$_2$ at a flow rate of 20 l/min, NH$_3$ at a flow rate of 10 l/min, and TMA at a flow rate of 1.8×10$^{-5}$ mol/min.

On the buffer layer 2 was formed the n$^+$-layer 3 of high carrier concentration (1.5×10$^{18}$/cm$^3$) of 2.2 μm thick GaN by supplying H$_2$ at a flow rate of 20 l/min, NH$_3$ at a flow rate of 10 l/min, TMG at a flow rate of 1.7×10$^{-4}$ mol/min, and silane (diluted to 0.86 ppm with H$_2$) at a flow rate of 200 ml/min, with the sapphire substrate 1 kept at 1150° C.

On the n$^+$-layer 3 was formed the n-layer 4 of low carrier concentration (1×10$^{15}$/cm$^3$) of 1.5 μm thick GaN by supplying H$_2$ at a flow rate of 20 l/min, NH$_3$ at a flow rate of 10 l/min, and TMG at a flow rate of 1.7×10$^{-4}$ mol/min, with the sapphire substrate 1 kept at 1150° C.

On the n-layer 4 was formed the i-layer 6 of 0.2 μm thick GaN by supplying H$_2$ at a flow rate of 20 l/min, NH$_3$ at a flow rate of 10 l/min, TMG at a flow rate of 1.7×10$^{-4}$ mol/min, and DEZ at a flow rate of 1.5×10$^{-4}$ mol/min, with the sapphire substrate 1 kept at 900° C.

Figure 2:
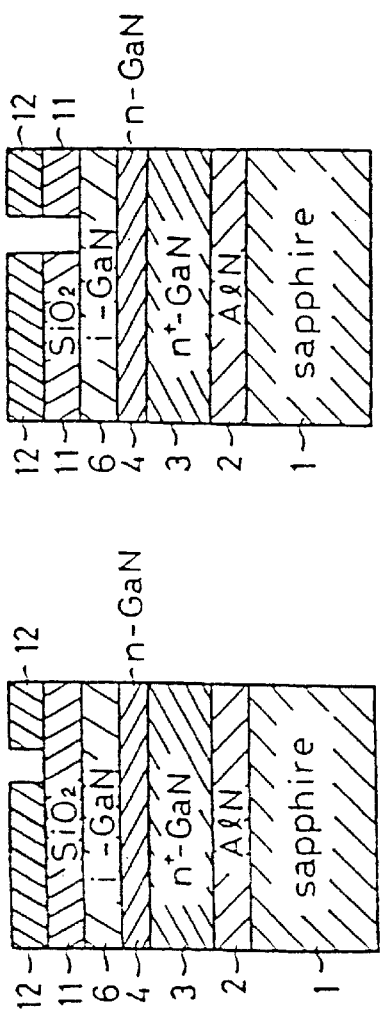
FIGS. 2 to 7 are sectional views illustrating processes for producing a light-emitting diode shown as to Example 1 of the present invention.

Thus there was obtained the multi-layer structure as shown in FIG. 2.

Figure 3:
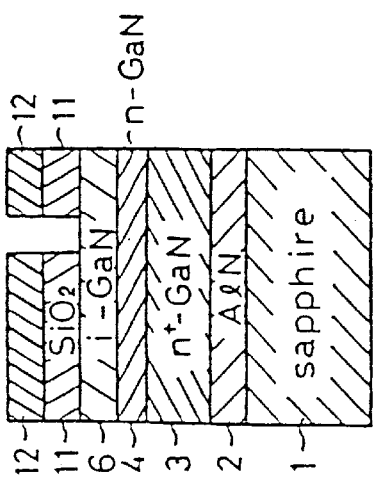

On the i-layer 6 was formed a 2000 Å thick SiO$_2$ layer 11 by sputtering as shown in FIG. 3. On the SiO$_2$ layer 11 was formed a photoresist layer 12 which subsequently underwent a photolithographic processing to make a pattern corresponding to a figure of the electrode connected to the n$^+$-layer 3.

Figure 4:
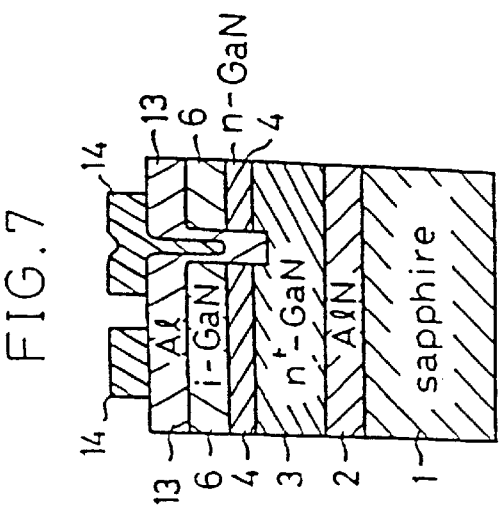

The exposed part (not covered by the photoresist layer 12) of the SiO$_2$ layer 11 underwent etching with hydrofluoric acid for its removal, as shown in FIG. 4.

Figure 5:
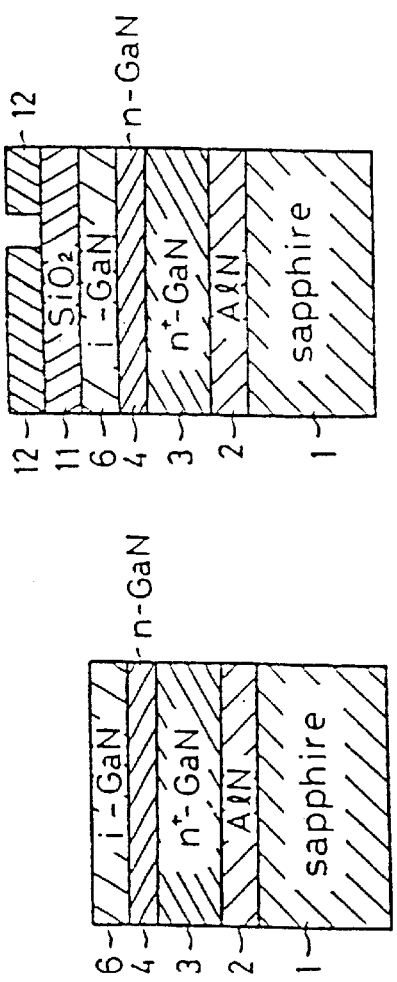

The exposed part (not covered by the photoresist layer 12 and the SiO$_2$ layer 11) of the i-layer 6 underwent dry etching with CCl$_2$F$_2$ gas at a flow rate of 10 cc/min and a high-frequency electric power of 0.44 W/cm$^2$ in a vacuum of 0.04 Torr and subsequently underwent dry etching with argon. The dry etching removed not only the exposed part of the i-layer 6 but also the n-layer 4 and the upper part of the n$^+$-layer 3 which are underneath the exposed part of the i-layer 6, as shown in FIG. 5.

Figure 6:
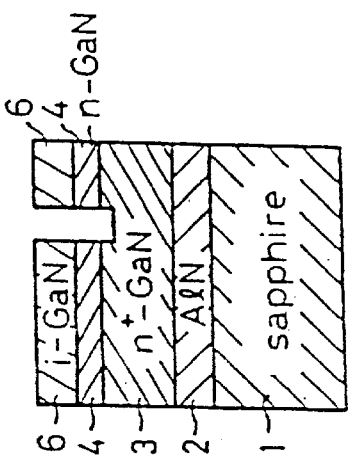

The SiO$_2$ layer 11 remaining on the i-layer 6 was removed with hydrofluoric acid as shown in FIG. 6.

Figure 7:
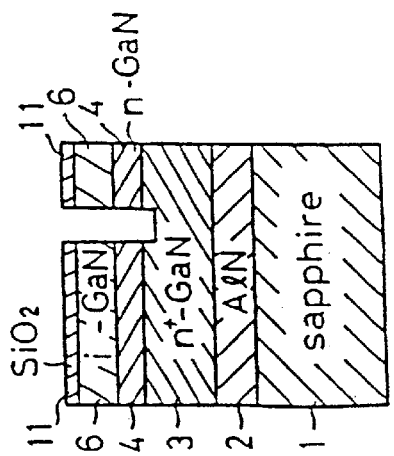

On the entire surface of the sample was formed an Al layer 13 by vapor deposition as shown in FIG. 7. On the Al layer 13 was formed a photoresist layer 14 which subsequently underwent the photolithographic processing to make a pattern corresponding to a figure of the electrodes connected to the n$^+$-layer 3 and the i-layer 6, respectively.

The exposed part (not covered by the photoresist layer 14) of the Al layer 13 underwent etching with nitric acid as shown in FIG. 7. The photoresist 14 was removed with acetone. Thus there were formed the electrode 8 for the n$^+$-layer 3 and the electrode 7 for the i-layer 6.

Such an above-mentioned process could make a gallium nitride light-emitting element of MIS (metal-insulator-semiconductor) structure as shown in FIG. 1.

The thus obtained light-emitting diode 10 was found to have a luminous intensity of 0.2 mcd. This value is 4 times higher than that of the conventional light-emitting diode which is composed simply of an i-layer with impurity concentration of $2\times10^{20}/cm^3$ and a 4 µm thick n-layer with carrier concentration of $5\times10^{17}/cm^3$.

In addition, the inspection of the luminescent surface revealed that the number of luminescent points is much greater than that of the conventional light-emitting diode.

Figure 8:
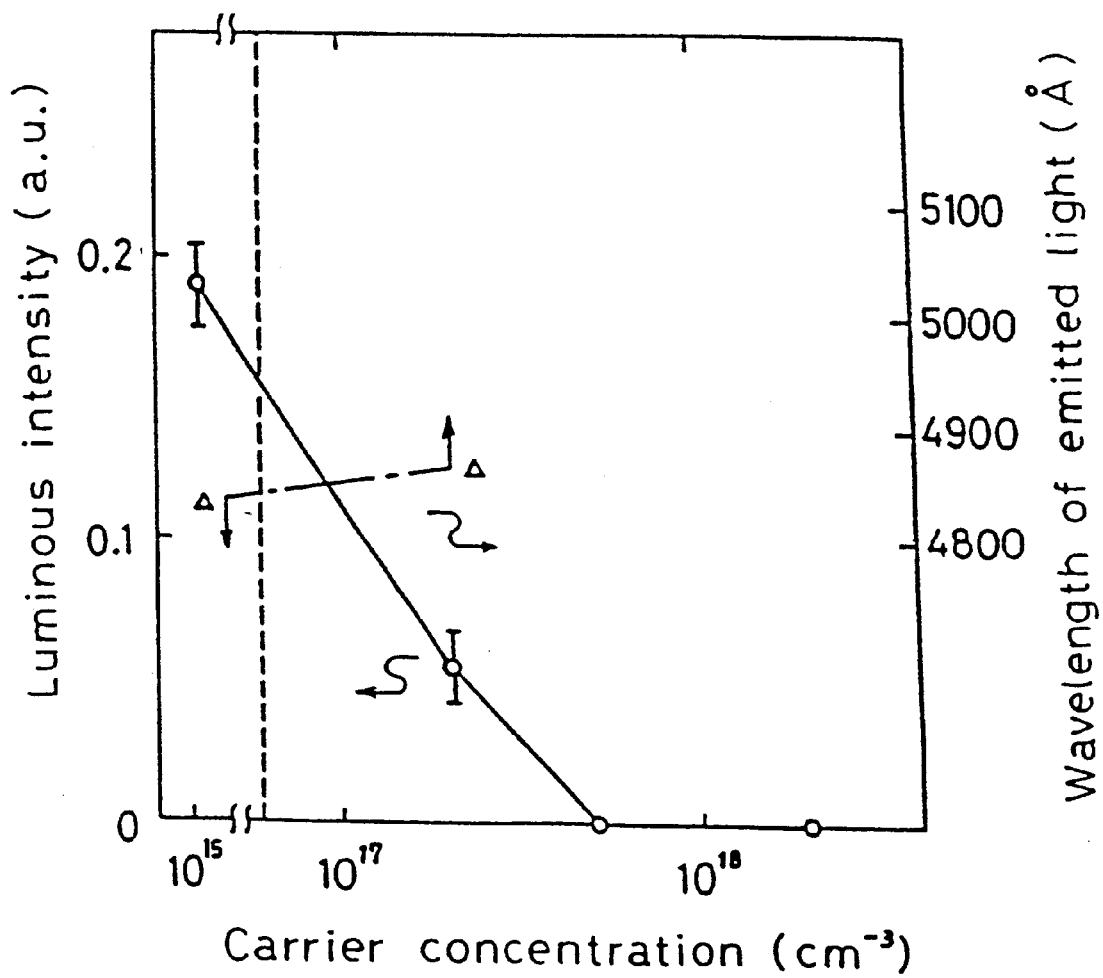
FIG. 8 is a diagram showing relationship between a carrier concentration of an n-layer of low carrier concentration and intensity or wavelength of emitted light with respect to a light-emitting diode shown as Example 1 of the present invention.

Several samples were prepared in the same manner as mentioned above except that the carrier concentration in the n-layer of low carrier concentration was varied, and they were tested for luminous intensity and emission spectrum. The results are shown in FIG. 8. It is noted that the luminous intensity decreases and the emission spectrum shifts to the red side according as the carrier concentration increases. This effect is estimated to be caused by that atoms of silicon as doping atoms diffuse or mix into the i-layer 6 as impurity atoms.

EXAMPLE 2

Figure 9:
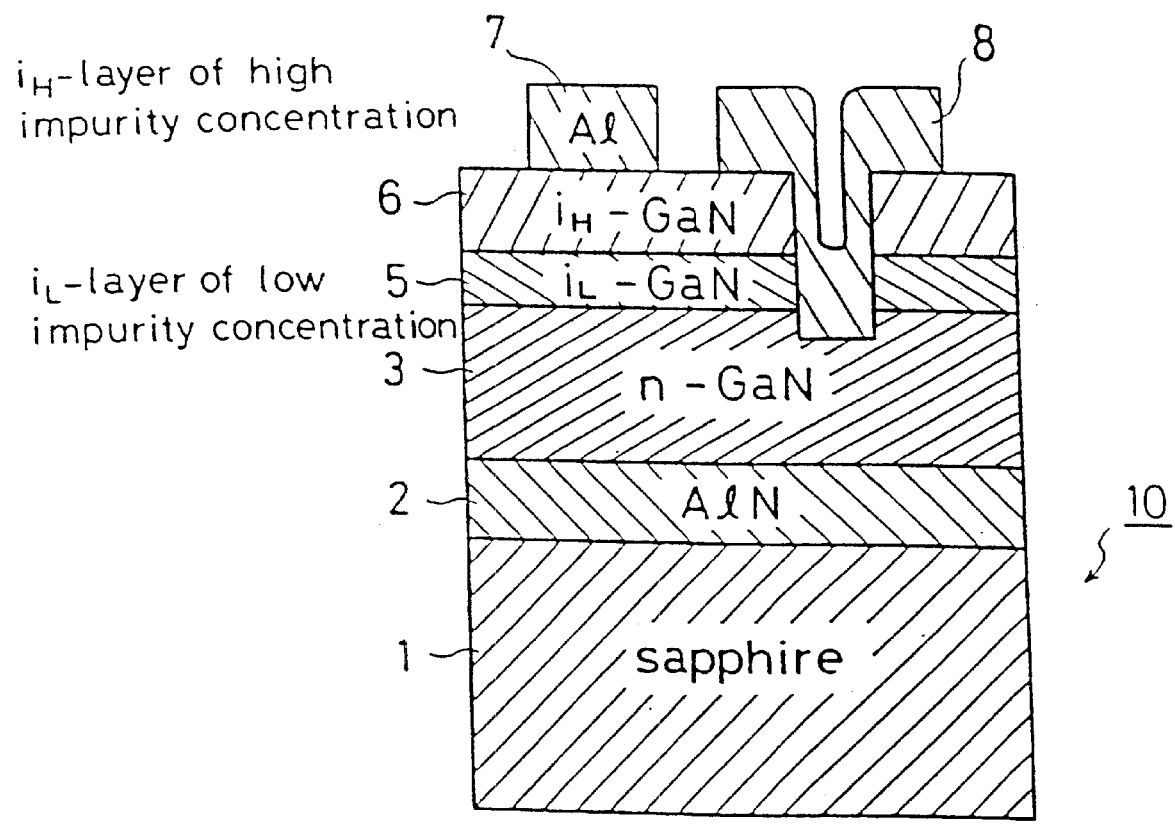
FIG. 9 is a diagram showing a structure of a light-emitting diode shown as Example 2 of the present invention.

In FIG. 9 there is shown a light-emitting diode 10 which has a sapphire substrate 1 on which is formed a 500 Å thick AlN buffer layer 2. On the buffer layer 2 are consecutively formed a 4 µm thick GaN n-layer 3 with carrier concentration of $5\times10^{17}/cm^3$, an $i_L$-layer 5 of low impurity concentration of $5\times10^{19}/cm^3$ of Zn, and an $i_H$-layer 6 of high impurity concentration ($2\times10^{20}/cm^3$ of Zn). To the $i_H$-layer 6 and n-layer 3 are connected aluminum electrodes 7 and 8, respectively.

This light-emitting diode 10 was produced by the MOVPE.

The gases employed in this process are $NH_3$, $H_2$ (as carrier gas), trimethyl gallium TMG, trimethyl aluminum TMA, and diethyl zinc DEZ.

The sapphire substrate 1 of single crystal, with its principal crystal plane (c-surface {0001}) cleaned by solvent washing and heat treatment, was set on the susceptor placed in the reaction chamber of the MOVPE apparatus.

The sapphire substrate 1 underwent vapor phase etching at 1100° C. with $H_2$ flowing through the reaction chamber at a flow rate of 2 l/min under normal pressure.

On the sapphire substrate 1 was formed the AlN buffer layer 2 (about 500 Å thick) at 400° C. by supplying $H_2$ at a flow rate of 20 l/min, $NH_3$ at a flow rate of 10 l/min, and TMA at a flow rate of $1.8\times10^{-5}$ mol/min.

On the buffer layer 2 was formed the 4 µm thick GaN n-layer 3 with carrier concentration of $1.5\times10^{17}/cm^3$ by supplying $H_2$ at a flow rate of 20 l/min, $NH_3$ at a flow rate of 10 l/min, and TMG at a flow rate of $1.7\times10^{-4}$ mol/min with stopping the feeding of TMA, with the sapphire substrate 1 kept at 1150° C.

On the n-layer 3 was formed the 0.2 µm thick GaN $i_L$-layer 5 of low impurity concentration ($5\times10^{19}/cm^3$ of Zn) by supplying $H_2$ at a flow rate of 20 l/min, $NH_3$ at a flow rate of 10 l/min, TMG at a flow rate of $1.7\times10^{-4}$ mol/min, and DEZ at a flow rate of $1.5\times10^{-4}$ mol/min, with the sapphire substrate 1 kept at 1000° C.

On the $i_L$-layer 5 was formed the 0.2 µm thick GaN $i_H$-layer 6 of high impurity concentration ($2\times10^{20}/cm^3$ of Zn) by supplying $H_2$ at a flow rate of 20 l/min, $NH_3$ at a flow rate of 10 l/min, TMG at a flow rate of $1.7\times10^{-4}$ mol/min, and DEZ at a flow rate of $1.5\times10^{-4}$ mol/min, with the sapphire substrate 1 kept at 900° C.

Figure 10:
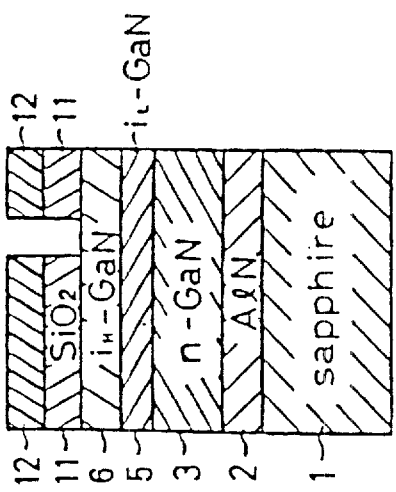
FIGS. 10 to 15 are sectional views illustrating processes for producing a light-emitting diode shown as Example 2 of the present invention.

Thus there was obtained the multi-layer structure as shown in FIG. 10.

Figure 11:
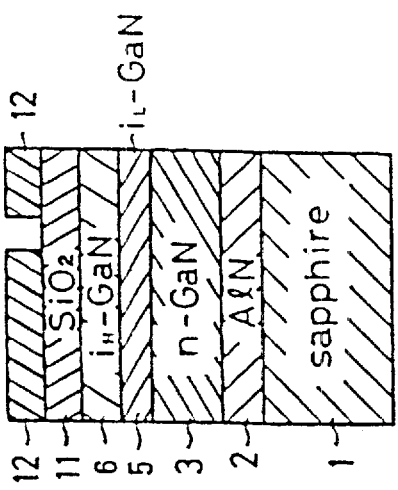

On the $i_H$-layer 6 was formed the 2000 Å thick $SiO_2$ layer 11 by sputtering as shown in FIG. 11. On the $SiO_2$ layer 11 was formed a photoresist layer 12 which subsequently underwent the photolithographic processing to make a pattern corresponding to the figure of the electrode connected to the n-layer 3.

Figure 12:
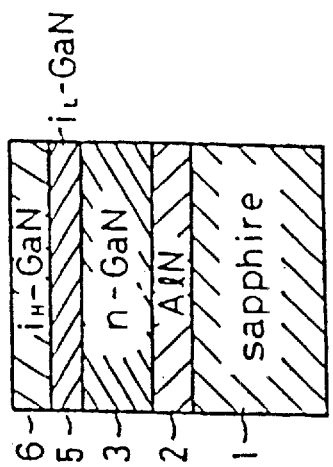

The exposed part (not covered by the photoresist layer 12) of the $SiO_2$ layer 11 underwent etching with hydrofluoric acid for its removal, as shown in FIG. 12.

Figure 13:
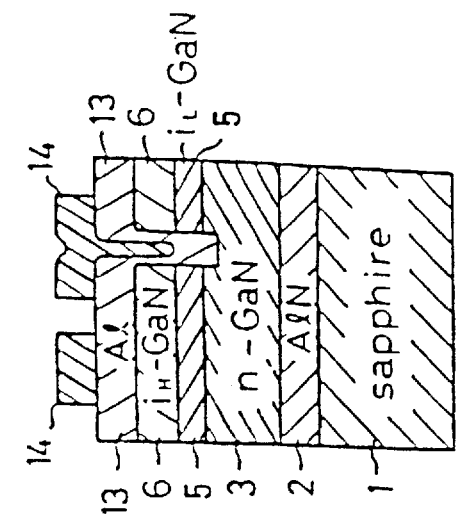

The exposed part (not covered by the photoresist layer 12 and the $SiO_2$ layer 11) of the $i_H$-layer 6 underwent dry etching with $CCl_2F_2$ gas at a flow rate of 10 cc/min and a high-frequency electric power of 0.44 W/cm2 in a vacuum of 0.04 Torr and subsequently underwent dry etching with argon. The dry etching removed not only the exposed part of the $i_H$-layer 6 but also the $i_L$-layer 5 and the upper part of the n-layer 3 which are underneath the exposed part of the $i_H$-layer 6. as shown in FIG. 13.

Figure 14:
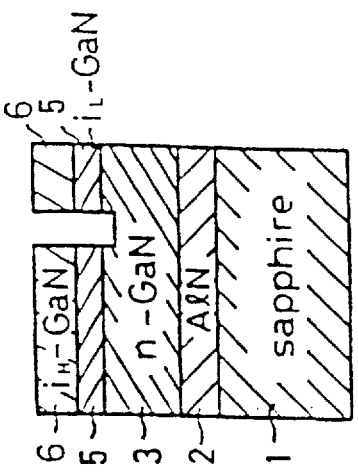

The $SiO_2$ layer 11 remaining on the $i_H$-layer 6 was removed with hydrofluoric arid as shown in FIG. 14.

Figure 15:
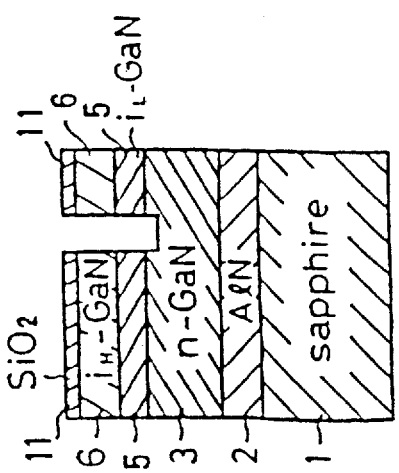

On the entire surface of the sample was formed an Al layer 13 by vapor deposition as shown in FIG. 15. On the Al layer 13 was formed the photoresist layer 14 which subsequently underwent the photolithographic processing to make a pattern corresponding to the figure of the electrodes connected to the n-layer 3 and the $i_H$-layer 6, respectively.

The exposed part (not covered by the photoresist layer 14) of the Al layer 13 underwent etching with nitric acid as shown in FIG. 15. The photoresist 14 was removed with acetone. Thus there were formed the electrode 8 for the n-layer 3 and the electrode 7 for the $i_H$-layer 6.

Such an above-mentioned process could make a gallium nitride light-emitting element of MIS structure as shown in FIG. 9.

The thus obtained light-emitting diode 10 was found to have a luminous intensity of 0.2 mcd. This value is 4 times higher than that of the conventional light-emitting diode which is composed simply of a 0.2 µm thick i-layer with impurity concentration of $2\times10^{20}/cm^3$ and a 4 µm thick n-layer with carrier concentration of $5\times10^{17}/cm^3$ In addition, the inspection of the luminescent surface revealed that the number of luminescent points is much greater than that of the conventional light-emitting diode.

Figure 16:
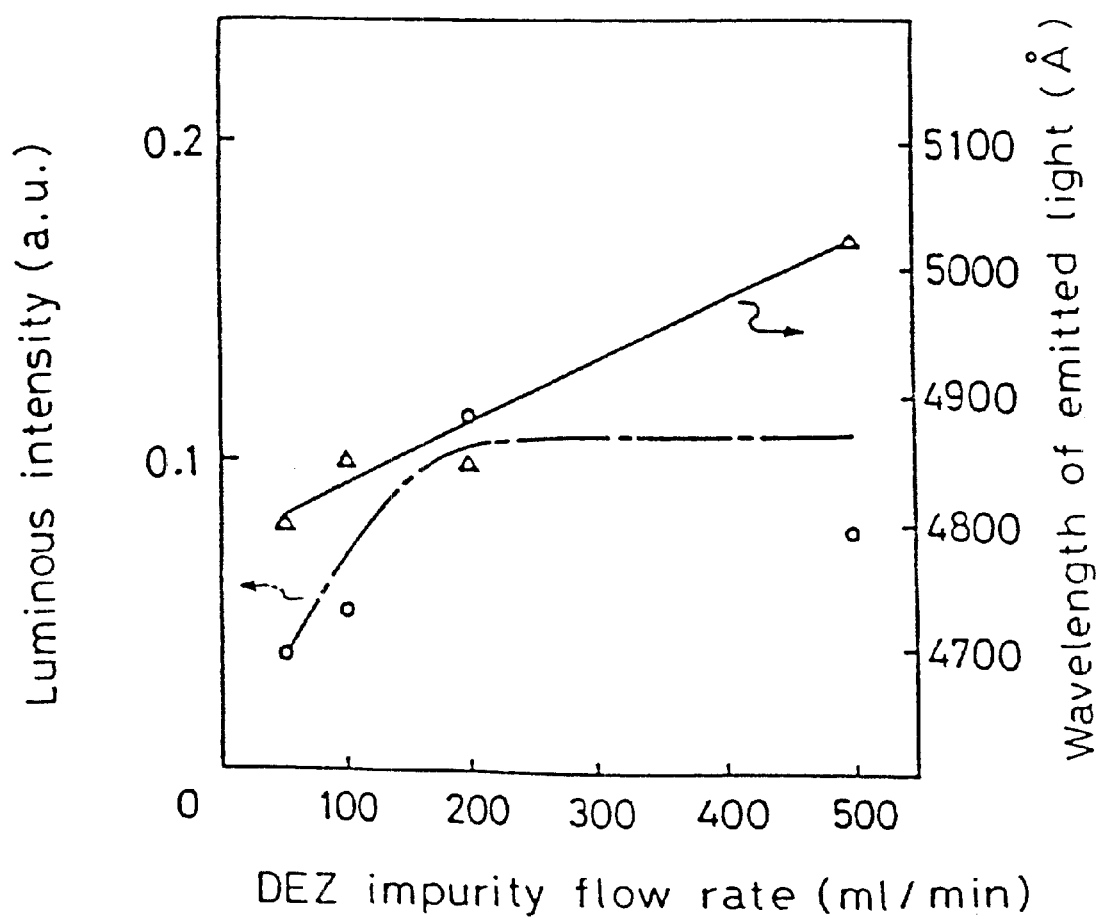
FIG. 16 is a diagram showing relationship between an impurity concentration of an $i_H$-layer of high impurity concentration and intensity or wavelength of emitted light with respect to a light-emitting diode shown as Example 2 of the present invention.

Several samples were prepared in the same manner as mentioned above except that the impurity concentration in the $I_H$-layer 6 of high impurity concentration was varied, and they were tested for luminous intensity and emission spectrum. The results are shown in FIG. 16. It is noted that the luminous intensity has a peak value and the emission spectrum shifts to a longer wavelength side when the impurity concentration increases.

EXAMPLE 3

Figure 17:
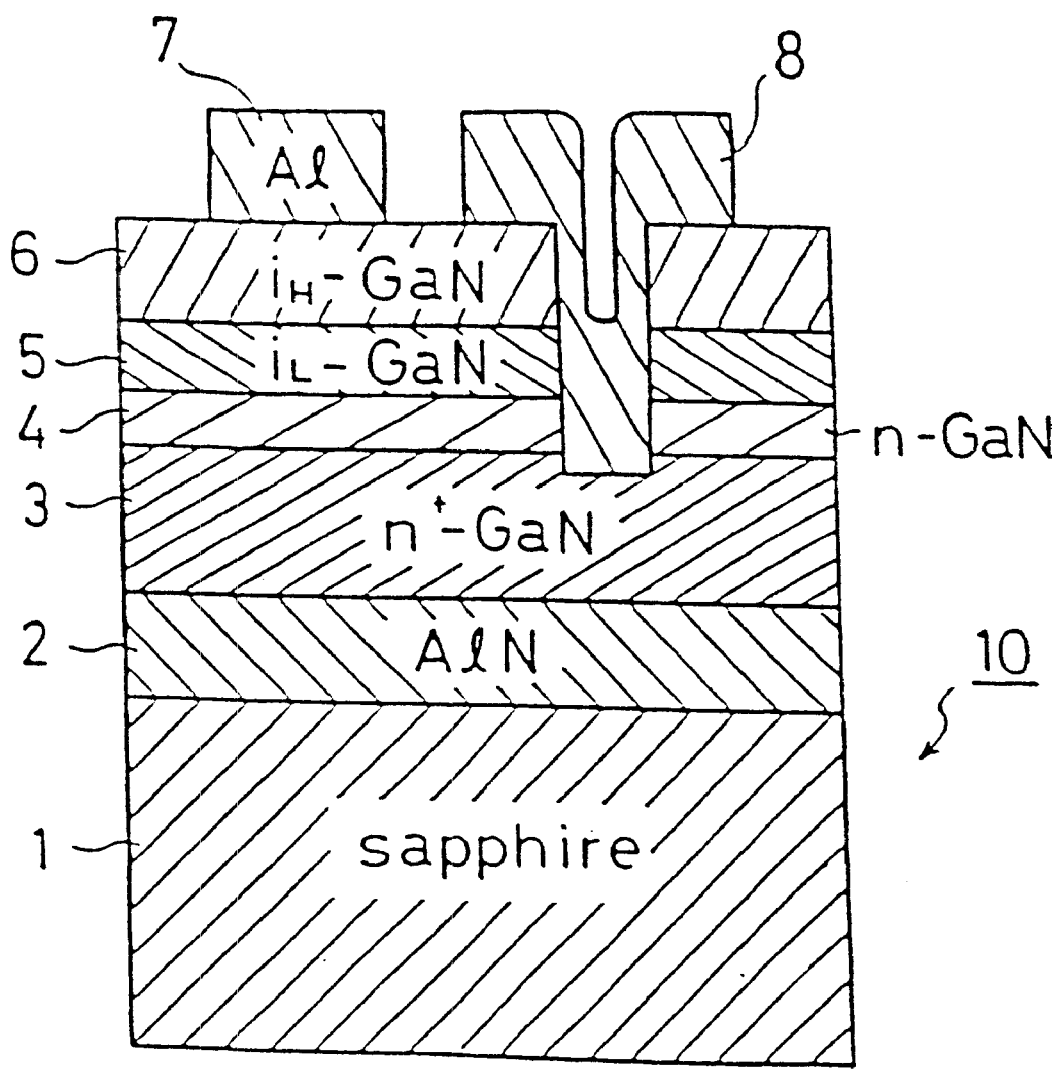
FIG. 17 is a diagram showing a structure of a light emitting diode shown as Example 3 of the present invention.

In FIG. 17 there is shown a light-emitting diode 10 which has a sapphire substrate 1 on which is formed a 500 Å thick AlN buffer layer 2. On the buffer layer 2 are consecutively formed a 2.2 µm thick GaN n⁺-layer 3 of high carrier concentration ($1.5\times10^{18}/cm^3$), a 1.5 µm thick GaN n-layer 4 of low carrier concentration ($1\times10^{15}/cm^3$), an $i_L$-layer 5 of low impurity concentration ($5\times10^{19}/cm^3$ of Zn), and an $i_H$-layer 6 of high impurity concentration ($2\times10^{20}/cm^3$ of Zn) To the $i_H$ layer 6 and n⁺-layer 3 are connected aluminum electrodes 7 and 8, respectively. This light-emitting diode 10 was produced by the MOVPE with organometal compound in the following manner.

The gases employed in this process are $NH_3$, $H_2$ (as carrier gas), trimethyl gallium ($Ga(CH_3)_3$) (TMG), trimethyl aluminum ($Al(CH_3)_3$) (TMA), silane ($SiH_4$), and diethyl zinc (DEZ).

The sapphire substrate 1 of single crystal, with its principal crystal plane (c-surface {0001}) cleaned by solvent washing and heat treatment, was set on the susceptor placed in the reaction chamber of the MOVPE apparatus.

The sapphire substrate 1 underwent vapor phase etching at 1100° C. with $H_2$ flowing through the reaction chamber at a flow rate of 2 l/min under normal pressure.

On the sapphire substrate 1 was formed the AlN buffer layer 2 (about 500 Å thick) at 400° C. by supplying $H_2$ at a flow rate of 20 l/min, $NH_3$ at a flow rate of 10 l/min, and TMA at a flow rate of $1.8 \times 10^{-5}$ mol/min.

On the buffer layer 2 was formed the 2.2 µm thick GaN $n^+$-layer 3 of high carrier concentration ($1.5 \times 10^{18}/cm^3$) by supplying $H_2$ at a flow rate of 20 l/min, $NH_3$ at a flow rate of 10 l/min, TMG at a flow rate of $1.7 \times 10^{-4}$ mol/min, and silane (diluted to 0.86 ppm with $H_2$) at a flow rate of 200 ml/min for 30 minutes, with the sapphire substrate 1 kept at 1150° C.

On the $n^+$-layer 3 was formed the 1.5 µm thick GaN n-layer 4 of low carrier concentration ($1 \times 10^{15}/cm^3$) by supplying $H_2$ at a flow rate of 20 l/min, $NH_3$ at a flow rate of 10 l/min, and TMG at a flow rate of $1.7 \times 10^{-4}$ mol/min, with the sapphire substrate 1 kept at 1150° C.

On the n-layer 4 was formed the 0.2 µm thick GaN $i_L$-layer 5 of low impurity concentration ($5 \times 10^{19}/cm^3$ of Zn) by supplying $H_2$ at a flow rate of 20 l/min, $NH_3$ at a flow rate of 10 l/min, TMG at a flow rate of $1.7 \times 10^{-4}$ mol/min, and DEZ at a flow rate of $1.5 \times 10^{-4}$ mol/min, with the sapphire substrate 1 kept at 1000° C.

On the $i_L$-layer 5 was formed the 0.2 µm thick GaN $i_H$-layer 6 of high impurity concentration ($2 \times 10^{20}/cm^3$ of Zn) by supplying $H_2$ at a flow rate of 20 l/min, $NH_3$ at a flow rate of 10 l/min, TMG at a flow rate of $1.7 \times 10^{-4}$ mol/min, and DEZ at a flow rate of $1.5 \times 10^{-4}$ mol/min, with the sapphire substrate 1 kept at 900° C.

Figure 18:
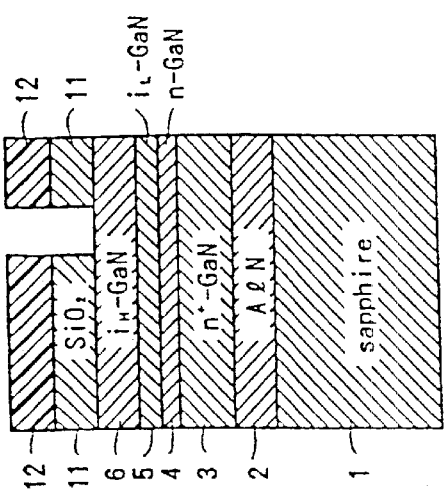
FIGS. 18 to 23 are sectional views illustrating processes for producing a light-emitting diode shown as Example 3 of the present invention.

Thus there was obtained the multi-layer structure as shown in FIG. 18.

Figure 19:
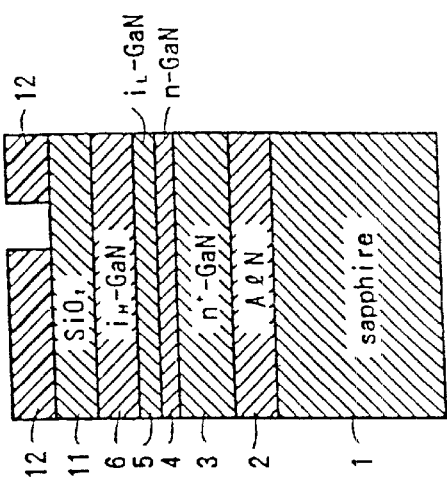

On the $i_H$-layer 6 was formed the 2000 Å thick $SiO_2$ layer 11 by sputtering as shown in FIG. 19. On the $SiO_2$ layer 11 was formed a photoresist layer 12 which subsequently underwent the photolithographic processing to make a pattern for the electrode connected to the $n^+$-layer 3.

Figure 20:
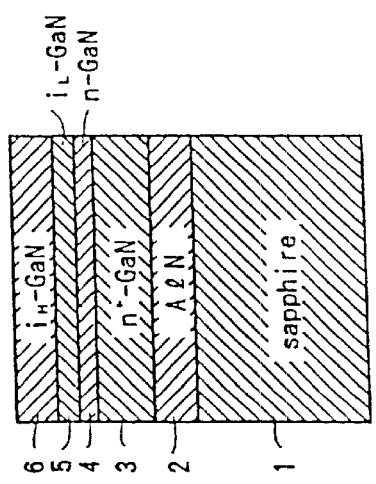

The exposed part (not covered by the photoresist layer 12) of the $SiO_2$ layer 11 underwent etching with hydrofluoric acid for its removal, as shown in FIG. 20.

Figure 21:
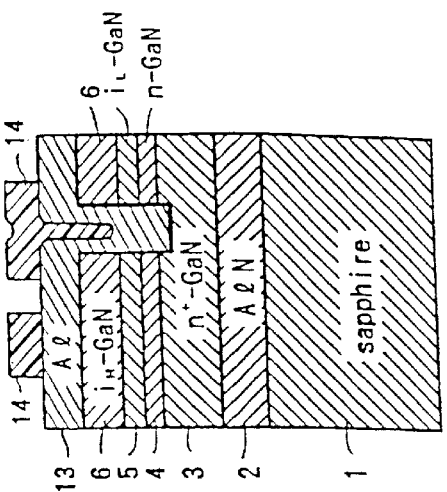

The exposed part (not covered by the photoresist layer 12 and the $SiO_2$ layer 11) of the $i_H$-layer 6 underwent dry etching with $CCl_2F_2$ gas at a flow rate of 10 cc/min and a high-frequency electric power of 0.44 $W/cm^2$ in a vacuum of 0.04 Torr and subsequently underwent dry etching with argon. The dry etching removed not only the exposed part of the $i_H$-layer 6 but also the $i_L$-layer 5 and the n-layer 4 and the upper part of the $n^+$-layer 3 which are underneath the exposed part of the $i_H$-layer 6, as shown in FIG. 21.

Figure 22:
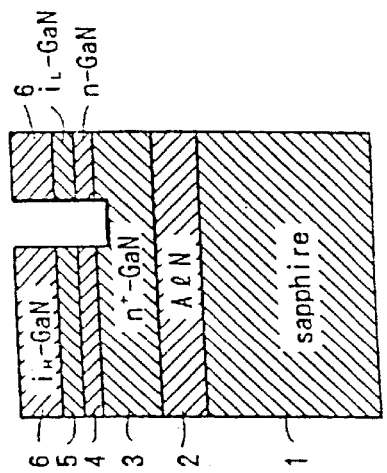

The $SiO_2$ layer 11 remaining on the $i_H$-layer 6 was removed with hydrofluoric arid as shown in FIG. 22.

Figure 23:
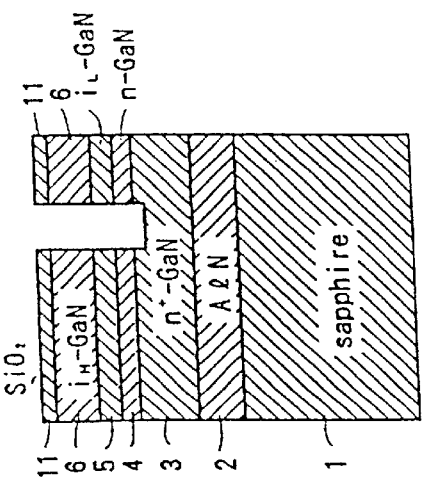

On the entire surface of the sample was formed an Al layer 13 by vapor deposition as shown in FIG. 23. On the Al layer 13 was formed the photoresist layer 14 which subsequently underwent the photolithographic processing to make a pattern for the electrodes connected to the $n^+$-layer 3 and the $i_H$-layer 6, respectively.

The exposed part (not covered by the photoresist layer 14) of the Al layer 13 underwent etching with nitric acid as shown in FIG. 23. The photoresist 14 was removed with acetone. Thus there were formed the electrode 8 for the $n^+$-layer 3 and the electrode 7 for the $i_H$-layer 6.

Such an above-mentioned process could make a gallium nitride light-emitting element of MIS structure as shown in FIG. 17.

The thus obtained light-emitting diode 10 was found to have a luminous intensity of 0.4 mcd. This value is 8 times higher than that of the conventional light-emitting diode which is composed simply of a 0.2 µm thick i-layer with impurity concentration of $2 \times 10^{20}/cm^3$ and a 4 µm thick n-layer with a carrier concentration of $5 \times 10^{17}/cm^3$.

In addition, the inspection of the luminescent surface revealed that the number of luminescent points is much greater than that of the conventional light-emitting diode.

Figure 24:
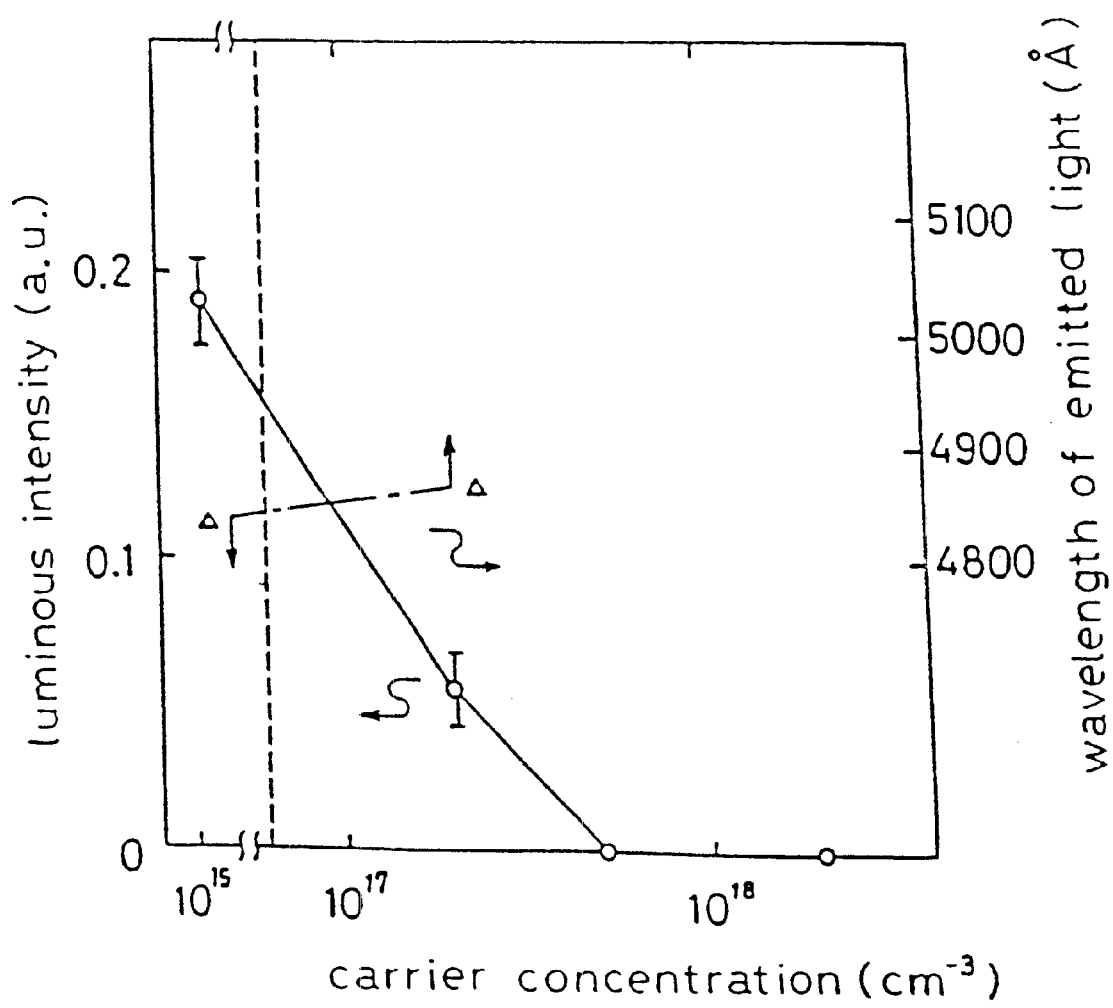
FIG. 24 is a diagram showing relationship between a carrier concentration of an n-layer of low carrier concentration and intensity or wavelength of emitted light with respect to a light-emitting diode shown as Example 3 of the present invention.

Several samples were prepared in the same manner as mentioned above except that the carrier concentration in the n-layer 4 of low carrier concentration was varied, and they were tested for luminous intensity and emission spectrum. The results are shown in FIG. 24. It is noted that the luminous intensity decreases and the emission spectrum shifts to the red side according as the carrier concentration increases.

Figure 25:
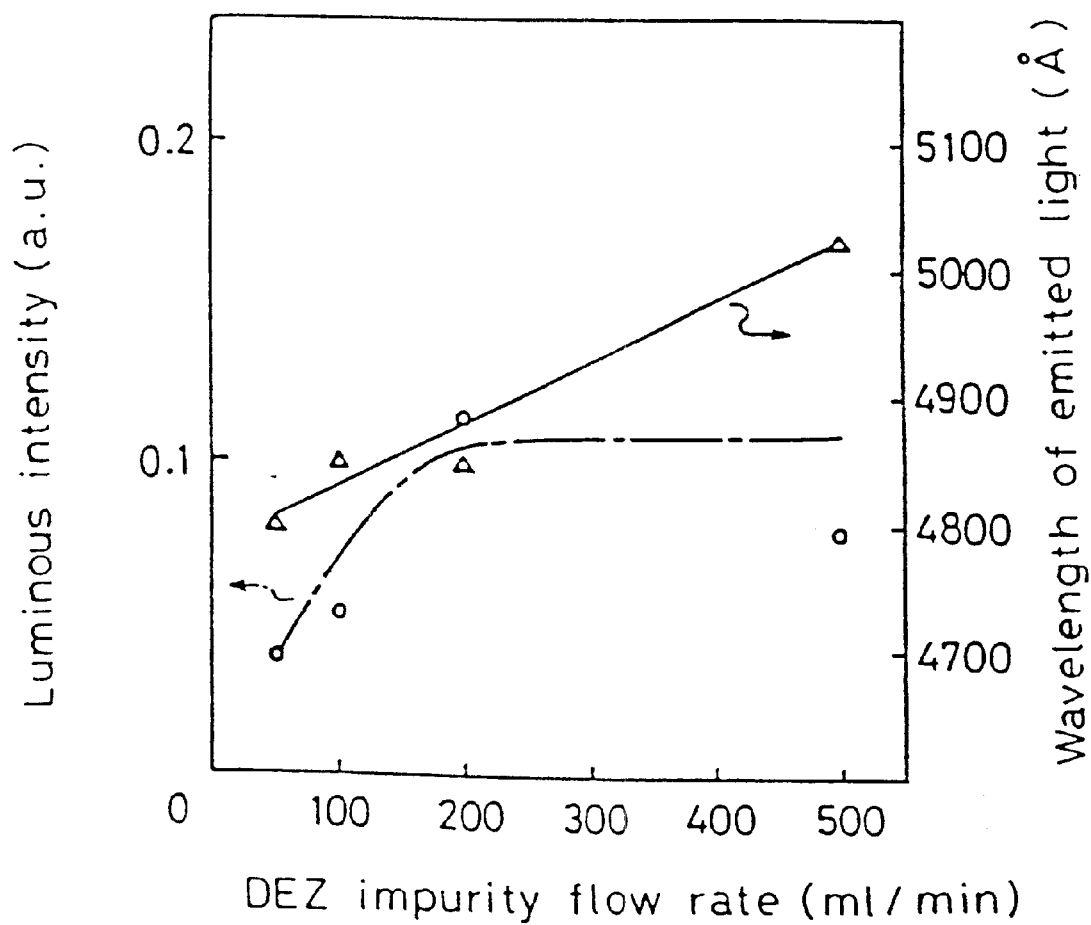
FIG. 25 is a diagram showing relationship between an impurity concentration of an is-layer of high impurity concentration and intensity or wavelength of emitted light with respect to a light-emitting diode shown as Example 3 of the present invention.

Also, several samples were prepared in the same manner as mentioned above except that the impurity concentration in the $i_H$-layer 6 of high impurity concentration was varied, and they were tested for luminous intensity and emission spectrum. The results are shown in FIG. 25. It is noted that the luminous intensity has a peak value and the emission spectrum shifts to a longer wavelength side when the impurity concentration increases.

EXAMPLE 4

Figure 26:
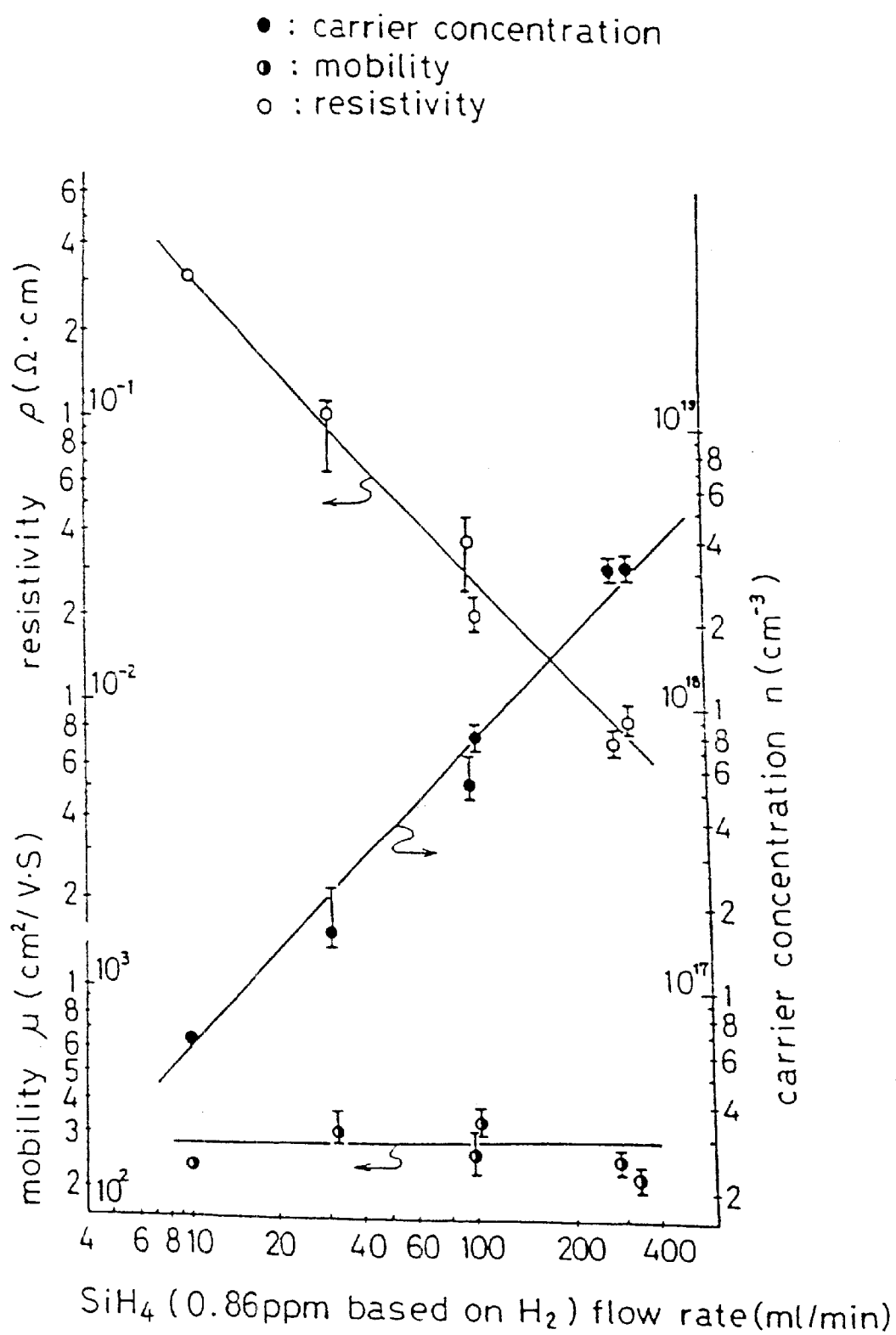
FIG. 26 is a diagram showing the relationship between a flow rate of silane gas and electrical properties of an n-layer formed by vapor phase epitaxy in a process shown as Example 4 of the present invention.

A light-emitting diode 10 of the same structure as in Example 1 was prepared in the same manner as in Example 1 according to the steps shown in FIGS. 2 to 7. The resistivity of the $n^+$-layer 3 was varied in the range of $3 \times 10^{-1}$ Ωcm to $8 \times 10^{-3}$ Ωcm by changing the conditions of the vapor phase epitaxy for the $n^+$-layer 3 of high carrier concentration, as shown in FIG. 26. The vapor phase epitaxy was carried out by supplying $H_2$ at a flow rate of 20 l/min, $NH_3$ at a flow rate of 10 l/min, TMG-carrying $H_2$ at a flow rate of 100 cc/min, and $H_2$-diluted silane (0.86 ppm) at a flow rate of 10 cc/min to 300 cc/min. (The TMG-carrying $H_2$ was prepared by bubbling $H_2$ in TMG cooled at −15° C.)

In the above-mentioned case, the resistivity of the $n^+$-layer 3 was varied by changing the flow rate of silane, but it is also possible to achieve the same object by changing the flow rate of other raw material gases or by changing the mixing ratio of silane and other raw material gases.

In this example, silane was used as the Si dopant, but it can be replaced by an organosilicon compound such as tetraethylsilane ($Si(C_2H_5)_4$) in a gaseous state prepared by bubbling with $H_2$.

The process mentioned above permits one to prepare the $n^+$-layer 3 of high carrier concentration and the n-layer 4 of low carrier concentration in such a manner that their resistivity can be controlled as desired.

The thus obtained light-emitting diode 10 was found to have a luminous intensity of 0.2 mcd. This value is 4 times higher than that of the conventional light-emitting diode which is composed simply of an i-layer and an n-layer. In addition, the inspection of the luminescent surface revealed that the number of luminescent points is much greater than that of the conventional light-emitting diode.

What is claimed is:

1. A gallium nitride group compound semiconductor wherein a conductivity (1/resistivity) of said gallium nitride group compound semiconductor is set at any value in a range in which said conductivity substantially linearly increases with respect to a mixing ratio of silicon-containing gas to raw material gases to form said gallium nitride group compound semiconductor.

2. A gallium nitride group compound semiconductor according to claim 1, wherein said gallium nitride group compound semiconductor is $Al_xGa_{1-x}N$ ($0 \leq x \leq 1$).

3. A gallium nitride group compound semiconductor according to claim 2, wherein said conductivity (1/resistivity) is not less than $3.3/\Omega cm$.

4. A gallium nitride group compound semiconductor according to claim 2, wherein said conductivity (1/resistivity) is ranging from $3.3/\Omega cm$ to $1.3 \times 10^2/\Omega cm$.

5. A gallium nitride group compound semiconductor according to claim 2, wherein said gallium nitride group compound semiconductor is formed on or above a buffer layer which is formed on a sapphire substrate.

6. A gallium nitride group compound semiconductor according to claim 5, wherein said buffer layer is formed on said sapphire substrate by using an organometallic compound vapor phase epitaxy at a growth temperature lower than that of said gallium nitride, group compound semiconductor.

7. A gallium nitride group compound semiconductor according to claim 1, wherein said gallium nitride group compound semiconductor is GaN.

8. A gallium nitride group compound semiconductor according to claim 7, wherein said conductivity (1/resistivity) is not less than $3.3/\Omega cm$.

9. A gallium nitride group compound semiconductor according to claim 7, wherein said conductivity (1/resistivity) is ranging from $3.3/\Omega cm$ to $1.3 \times 10^2/\Omega cm$.

10. A gallium nitride group compound semiconductor according to claim 1, wherein said conductivity (1/resistivity) is not less than $3.3/\Omega cm$.

11. A gallium nitride group compound semiconductor according to claim 10, wherein said gallium nitride group compound semiconductor is formed on or above a buffer layer which is formed on a sapphire substrate.

12. A gallium nitride group compound semiconductor according to claim 11, wherein said buffer layer is formed on said sapphire substrate by using an organometallic compound vapor phase epitaxy at a growth temperature lower than that of said gallium nitride group compound semiconductor.

13. A gallium nitride group compound semiconductor according to claim 1, wherein said conductivity (1/resistivity) is ranging from $3.3/\Omega cm$ to $1.3 \times 10^2/\Omega cm$.

14. A gallium nitride group compound semiconductor according to claim 13, wherein said gallium nitride group compound semiconductor is formed on or above a buffer layer which is formed on a sapphire substrate.

15. A gallium nitride group compound semiconductor according to claim 14, wherein said buffer layer is formed on said sapphire substrate by using an organometallic compound vapor phase epitaxy at a growth temperature lower than that of said gallium nitride group compound semiconductor.

16. A gallium nitride group compound semiconductor according to claim 1, wherein said gallium nitride group compound semiconductor is formed on or above a buffer layer which is formed on a sapphire substrate.

17. A gallium nitride group compound semiconductor according to claim 16, wherein said buffer layer is formed on said sapphire substrate by using an organometallic compound vapor phase epitaxy at a growth temperature lower than that of said gallium nitride group compound semiconductor.

18. A gallium nitride group compound semiconductor wherein an electron concentration is set at any value in a range in which said electron concentration of said gallium nitride compound semiconductor substantially linearly increases with respect to a mixing ratio of silicon-containing gas to raw material gases to form said gallium nitride group compound semiconductor.

19. A gallium nitride group compound semiconductor according to claim 18, wherein said gallium nitride group compound semiconductor is $Al_xGa_{1-x}N$ ($0 \leq x \leq 1$).

20. A gallium nitride group compound semiconductor according to claim 19, wherein said electron concentration is not less than $6 \times 10^{16}/cm^3$.

21. A gallium nitride group compound semiconductor according to claim 19, wherein said electron concentration is ranging from $6 \times 10^{16}/cm^3$ to $3 \times 10^{18}/cm^3$.

22. A gallium nitride group compound semiconductor according to claim 19, wherein said gallium nitride group compound semiconductor is formed on or above a buffer layer which is formed on a sapphire substrate.

23. A gallium nitride group compound semiconductor according to claim 22, wherein said buffer layer is formed on said sapphire substrate by using an organometallic compound vapor phase epitaxy at a growth temperature lower than that of said gallium nitride group compound semiconductor.

24. A gallium nitride group compound semiconductor according to claim 19, wherein said electron concentration is ranging from $1 \times 10^{17}/cm^3$ to $1 \times 10^{19}/cm^3$.

25. A gallium nitride group compound semiconductor according to claim 18, wherein said gallium nitride group compound semiconductor is GaN.

26. A gallium nitride group compound semiconductor according to claim 25, wherein said electron concentration is not less than $6 \times 10^{16}/cm^3$.

27. A gallium nitride group compound semiconductor according to claim 25, wherein said electron concentration is ranging from $6 \times 10^{16}/cm^3$ to $3 \times 10^{18}/cm^3$.

28. A gallium nitride group compound semiconductor according to claim 25, wherein said electron concentration is ranging from $1 \times 10^{17}/cm^3$ to $1 \times 10^{19}/cm^3$.

29. A gallium nitride group compound semiconductor according to claim 18, wherein said electron concentration is not less than $6 \times 10^{16}/cm^3$.

30. A gallium nitride group compound semiconductor according to claim 29, wherein said gallium nitride group compound semiconductor is formed on or above a buffer layer which is formed on a sapphire substrate.

31. A gallium nitride group compound semiconductor according to claim 30, wherein said buffer layer is formed on said sapphire substrate by using an organometallic compound vapor phase epitaxy at a growth temperature lower than that of said gallium nitride group compound semiconductor.

32. A gallium nitride group compound semiconductor according to claim 18, wherein said electron concentration is ranging from $6 \times 10^{16}/cm^3$ to $3 \times 10^{18}/cm^3$.

33. A gallium nitride group compound semiconductor according to claim 32, wherein said gallium nitride group compound semiconductor is formed on or above a buffer layer which is formed on a sapphire substrate.

34. A gallium nitride group compound semiconductor according to claim 33, wherein said buffer layer is formed on said sapphire substrate by using an organometallic compound vapor phase epitaxy at a growth temperature lower than that of said gallium nitride group compound semiconductor.

35. A gallium nitride group compound semiconductor according to claim 18, wherein said gallium nitride group compound semiconductor is formed on or above a buffer layer which is formed on a sapphire substrate.

36. A gallium nitride group compound semiconductor according to claim 35, wherein said buffer layer is formed on said sapphire substrate by using an organometallic compound vapor phase epitaxy at a growth temperature lower than that of said gallium nitride group compound semiconductor.

37. A gallium nitride group compound semiconductor according to claim 18, wherein said electron concentration is ranging from $1\times10^{17}/cm^3$ to $1\times10^{19}/cm^3$.

* * * * *